(12) United States Patent
Kaupp et al.

(10) Patent No.: US 6,287,695 B1
(45) Date of Patent: Sep. 11, 2001

(54) CORROSION-STABLE ALUMINUM PIGMENTS AND PROCESS FOR THE PRODUCTION THEREOF

(75) Inventors: Günter Kaupp, Neuhaus; Werner Ostertag, Grünstadt; Günter Sommer, Lauf, all of (DE)

(73) Assignee: Eckart-Werke Standard Bronzepulver-Werke Carl Eckart GmbH & Co., Furth (DE)

( * ) Notice: Subject to any disclaimer, the term of this patent is extended or adjusted under 35 U.S.C. 154(b) by 0 days.

(21) Appl. No.: 08/910,978

(22) Filed: Aug. 7, 1997

(30) Foreign Application Priority Data

Aug. 30, 1996 (DE) .............................................. 196 35 085

(51) Int. Cl.$^7$ ..................................................... B32B 5/16
(52) U.S. Cl. ........................................... 428/403; 428/404
(58) Field of Search .................................. 428/402, 403, 428/404

(56) References Cited

U.S. PATENT DOCUMENTS

| | | |
|---|---|---|
| 3,438,796 | 4/1969 | Hanke . |
| 3,858,977 | 1/1975 | Baird et al. . |
| 3,883,944 * | 5/1975 | Davis et al. ........................... 29/460 |
| 3,949,139 | 4/1976 | Dunning et al. . |
| 3,955,935 * | 5/1976 | Schockley et al. .................... 29/194 |
| 3,992,161 * | 11/1976 | Cairns et al. ....................... 29/182.5 |
| 4,298,404 * | 11/1981 | Greene .............................. 148/6.14 |
| 4,321,087 | 3/1982 | Levine et al. . |
| 4,565,716 | 1/1986 | Williams, Jr. et al. . |
| 4,610,798 * | 9/1986 | Burkus ............................... 252/79.2 |
| 4,629,512 | 12/1986 | Kondis . |
| 4,808,231 | 2/1989 | Kondis et al. . |
| 4,879,140 * | 11/1989 | Gray et al. .............................. 427/38 |
| 4,916,014 * | 4/1990 | Weber et al. ......................... 428/403 |
| 5,059,245 * | 10/1991 | Phillips et al. ......................... 106/22 |
| 5,135,812 | 8/1992 | Phillips et al. . |
| 5,215,579 | 6/1993 | Keemer et al. . |
| 5,332,767 * | 7/1994 | Reisser et al. ....................... 523/209 |
| 5,352,286 | 10/1994 | Schmid et al. . |
| 5,356,469 | 10/1994 | Jenkins et al. . |
| 5,401,381 * | 3/1995 | Seidel et al. ......................... 205/177 |
| 5,434,104 * | 7/1995 | Cain et al. ........................... 437/198 |
| 5,474,605 * | 12/1995 | Schmid et al. ....................... 106/404 |
| 5,498,781 | 3/1996 | Hall et al. . |
| 5,520,750 * | 5/1996 | Riley ................................... 148/261 |
| 5,733,364 | 3/1998 | Schmid et al. . |
| 5,871,827 * | 2/1999 | Jaffe et al. ............................. 428/29 |
| 5,931,996 * | 8/1999 | Reisser et al. ....................... 106/404 |
| 6,013,370 * | 1/2000 | Coulter et al. ....................... 428/403 |

FOREIGN PATENT DOCUMENTS

| | | |
|---|---|---|
| 0319971 | 6/1989 | (EP) . |
| 0 227 423 B1 | 6/1992 | (EP) . |
| 49031403 | 3/1974 | (JP) . |
| 61016968 | 1/1986 | (JP) . |
| 01119601 | 5/1989 | (JP) . |
| WO 93/23481 | 11/1993 | (WO) . |

* cited by examiner

*Primary Examiner*—Hoa T. Le
(74) *Attorney, Agent, or Firm*—Hoffmann & Baron, LLP

(57) ABSTRACT

In aluminum-based metal pigments produced by physical vapor deposition of a metal film and subsequent crushing of the metal film metal surfaces which are exposed after the operation of crushing the metal film and in particular fracture surfaces thereof are covered with a passivating protective layer to afford corrosion stability of those metal pigments.

13 Claims, No Drawings

CORROSION-STABLE ALUMINUM PIGMENTS AND PROCESS FOR THE PRODUCTION THEREOF

FIELD OF THE INVENTION

The present invention concerns corrosion-stable aluminum pigments produced by physical vapor deposition and a process for the stabilization thereof.

BACKGROUND OF THE INVENTION

Pigments which are produced by way of physical vapor deposition (PVD) of single-layer or multi-layer films on a carrier, subsequent detachment and then crushing of the films or film packs are becoming of increasing interest in very recent times because of their special optical properties. Thus for example single-layer aluminum pigment which is produced by way of PVD and which is known under the name METALURE (registered mark) is highly valued in the printing and paints industry because of its outstanding mirror shine while multi-layer so-called optically variable pigments which have brilliant interference colors and which produce pronounced angle-dependent color shade variations are increasingly used in paints, plastic materials and in bond printing.

The single-layer aluminum scales or flakes with a very high degree of shine of the above-mentioned aluminum pigment are produced by vacuum deposition on a substrate provided with a release layer, subsequent detachment of the aluminum film, and mechanical crushing thereof. The thickness of the film particles is generally less than 100 nm. The scale or flake surface is mirror-smooth and is of the highest level of perfection. The flake or scale surface can however also have a hologram-like embossing (WO 93/23481). Depending on the embossing involved such flakes appear in variable colors.

The basic structure of optically variable multi-layer pigments is as follows: following a central highly reflective metal layer M, towards each side, is a transparent low-refractive layer T and then a semi-transparent metal layer M'. Films which involve a multi-layer structure of the type M'TM have been known for many years (see Optical Acta 20, 925–937 (1973) and U.S. Pat. No. 3,858,977). Pigments which embody the optical principle which is applicable in respect of films and which have the above-mentioned layer sequence M'TMTM' were first described in U.S. Pat. No. 3,438,796. The flake-like pigment particles, envisaged for the area of use of decorative paints and lacquers, exhibit brilliant colors and comprise a highly reflective, central aluminum layer which is at least 60 nm in thickness and which is accompanied in an outward direction by a respective $SiO_2$-layer which is between 100 and 600 nm in thickness and which is then followed by a semi-transparent aluminum layer which is between 5 and 40 nm in thickness. Thereover there is also an $SiO_2$-protective layer. The production of such pigments is effected by vapor deposition of subsequent layers and then crushing of the multi-layer film to the particle size of special-effect pigments. So as to facilitate detachment of the film from the substrate it is covered with a release layer. The color of the pigments produced in that way depends on the thickness of the $SiO_2$-layers. Each color shade of the spectrum can be specifically set by way of the choice of the thickness of the $SiO_2$-layers. Higher-order interference colors are also possible.

Pigments involving a similar structure and a similar production process are described in U.S. Pat. No. 5,135,812 and EP-A 227 423. Those pigments have a multi-layer structure, wherein the central opaque layer comprises a highly reflective metal layer, generally aluminum, the transparent layers which follow it in an outward direction comprise $MgF_2$ or $SiO_2$ (refractive index n<1.65) and a semi-transparent or semi-opaque metal layer. The area of use is printing inks for forgery-resistant banknotes. The pigments are produced by physical vapor deposition in a vacuum and then crushing of the multi-layer film, generally in an ultrasonic crusher, to pigment particle size.

The pigments described in the above-indicated patents suffer from the disadvantage that they are susceptible to corrosion by virtue of exposed metal surfaces. Admittedly the pigments which are produced from films manufactured by vapor deposition in a multi-layer structure can already be passivated on the large surfaces of the pigment particles by the production of a protective layer in the vapor deposition process, as was effected in accordance with U.S. Pat. No. 3,438,796. The operation of crushing the multi-layer film however also gives rise to fresh fracture locations which, due to the procedure involved, are unprotected and are therefore highly sensitive to corrosion. Particularly in the presence of moisture, acids or bases, the chemical reactivity of the fresh fracture locations results in corrosion and thus inevitably results in an impairment in the brilliance and coloristics of the pigment scales or flakes. That represents a serious problem in terms of technical application. U.S. Pat. No. 5,498,781 described an initial attempt at passivating optically variable pigments for aqueous coating systems. The ready-for-sale, optically variable pigment powder was thereafter surface-coated with a silane compound of the type $R_3$ Si—A—X, specifically $(CH_3CH_2O)_3Si(CH_2)_3NH_2$ in an aqueous alcohol solution, tempered at 110° C. and then reacted in an alcohol solution with a polymer bearing functional isocyanate groups.

The result is a finished lacquer or paint as is used for the decorative surface coating of motor vehicles. Thus the passivation operation described in U.S. Pat. No. 5,498,781 leads to a single system of use and lacks the multiple and varied use options of a passivated pigment. A further disadvantage of that passivation process is that the corrosion processes have already begun at the endangered fracture edges of the optically variable pigments when treatment of the finished pigment powder begins.

SUMMARY OF THE INVENTION

An object of the present invention is to improve the corrosion characteristics of pigments produced by PVD and subsequent crushing of the films.

Another object of the invention is to provide pigments produced by PVD and then crushing, which remain substantially stable even in aggressive aqueous such as acid or alkaline or solvent-based agents.

A further object of the invention is to provide that fresh fracture locations which are produced by a film-crushing operation, in relation to optically variable multi-layer pigments, more especially fracture locations of a central, highly reflective aluminum layer, are passivated.

A still further object of the invention is a process for the stabilization of aluminum-based metal pigments manufactured by physical vapor deposition and subsequent crushing of the metal film produced.

In accordance with the invention the foregoing and other objects are attained by an aluminum-based metal pigment produced by physical vapor deposition (PVD), wherein all metal surfaces and in particular fracture surfaces of the metal pigment particles, which are exposed after the step of crushing a metal film produced by PVD, are covered with a passivating protective layer.

In regard to the process aspect the foregoing and other objects are attained by a process for producing corrosion-stable aluminum-based metal pigment manufactured by means of physical vapor deposition (PVD) and subsequent crushing of the metal film produced. The pigment obtained by the crushing operation is treated with one or more substances of the group consisting of carboxylic acids, phosphonic acids, phosphoric acids, phosphomolybdic acid, alcohols, amines, amides and derivatives of said substances. Alternatively a metal oxide and/or metal hydroxide layer is deposited as a passivating protective layer on the free metal surfaces of the pigment obtained by the crushing operation, by hydrolysis of salts or metal acid esters from the group consisting of B, Al, Sn, Ti, V, Cr, Mo, Zn and Ce. Alternatively again an organically modified silicate, titanate, zirconate or aluminium zirconate layer is applied as a passivating protective layer to the free metal surfaces of the pigment obtained by the crushing operation from suitable organic solutions or by hydrolysis of suitably modified metal acid esters. A further alternative is that an organic polymer layer based on acrylates and/or methacrylates is applied as a passivating protective layer to the free metal surfaces of the pigment obtained by the crushing operation by radical polymerization in solution.

As will be seen in greater detail hereinafter from examples the invention provides that all exposed metal surfaces are covered with a very firmly adhering passivating layer with a barrier function. In that respect it is preferred that, in terms of the process of the invention, the passivating layer is applied during the film crushing step, that is to say therefore it is formed in situ directly in the production of fresh fracture edges. The chemically applied passivating protective layer must be of a nature such that—insofar as the large surfaces of the pigment particles are unprotected—the protective layer is deposited on the large surfaces of the pigment particles but also in particular covers over the fracture surfaces. As indicated above a number of compounds and operating procedures can be used for that purpose.

Thus the passivating protective layer can comprise substances of the group consisting of long-chain carboxylic acids, phosphonic acids, phosphoric acids, alcohols, amines, amides and derivatives of said substances with between 8 and 20 C-atoms and salt-like compounds of said substances. Those substances may be applied to the pigment particles either from suitable solutions or by direct treatment.

The protective layer however may also comprise at least one metal oxide layer and/or metal hydroxide layer of the group B, Al, Sn, Ti, V, Cr, Mo, Zn and Ce. That layer is precipitated by controlled hydrolysis of suitable salts or metal acid esters.

The protective layer may also comprise organically modified silicates, titanates, zirconates or aluminum zirconates and can also be applied from suitable organic solutions or by hydrolysis of suitably modified metal acid esters.

Another possible protective layer is an organic polymer layer based on acrylates and/or methacrylates which are applied by radical polymerization in solution. That protective layer can be applied to the pigments or in a particular configuration during the actual film crushing operation.

It is possible to conceive of a protective layer which is afforded by combinations of the above-listed substances and procedures.

Tests have also shown that it is advantageous, instead of pure aluminum, to use aluminum alloys with a higher level of resistance to corrosion. Particular emphasis is to be laid on the seawater-resistant aluminum alloy 'Hydronalium' (with 7% by weight of magnesium and a little silicon) and chromium-bearing aluminum alloys.

Operation is conducted in known manner in the production of the multi-layer pigments. In a roll coater which is a vacuum coating apparatus with an internally disposed foil roll which can be rolled up and unrolled, a foil which is firstly provided with a release layer is successively coated by way of physical vapor deposition with a semi-transparent aluminum layer, for example of between 5 and 40 nm in thickness, then a transparent $SiO_2$-layer for example of between 100 and 600 nm in thickness, then an opaque aluminum layer of >60 nm in thickness and then again with a transparent $SiO_2$-layer of for example between 100 and 600 nm in thickness and finally with a semi-transparent aluminum layer of for example between 5 and 40 nm in thickness. Instead of pure aluminum, aluminum-based alloys can also be used for the central aluminum layer and/or for the two semi-transparent aluminum layers. Vapor deposition of the aluminum or aluminum-based metal is effected electrically by way of resistance-heated boats or by sputtering. Sputtering is preferred for optically variable pigments. Sputtering is also the preferred method for the vapor deposition of $SiO_2$-layers or $SiO_2$-bearing layers. Mixing $SiO_2$ with cryolite is found to be advantageous as the $SiO_2$/cryolite layer is built up very much more quickly than the build-up of a pure $SiO_2$-layer and cryolite has approximately the same refractive index as $SiO_2$.

To produce the pigment from the multi-layer film, firstly the release layer is dissolved by means of a solvent, the film is peeled off the substrate and the film fragments which are produced in that case are crushed, possibly after washing and filtering. The operation of crushing the film fragments to pigment size is effected by ultrasound or mechanically by high-speed agitators in a liquid medium or after drying thereof in an air jet crusher with a sifter wheel. The free metal surfaces of the pigment which occurs in a particle size of between 5 and 60 $\mu$m, preferably between 12 and 36 $\mu$m, are coated with a passivating protective layer during the crushing operation or subsequently thereto by one of the above-mentioned processes according to the invention, depending on whether the pigment crushing operation is effected in a liquid medium or dry.

If the passivation operation is effected during the crushing operation, for example carboxylic acid, phosphoric acid or phosphoric acid ester or chromic acid is added to the liquid medium in which the film fragments are present in the crushing treatment. In that respect the medium must have at least a certain solution property for the respectively added passivation agent. Passivation of the dry powder, for example by adding for example metal oxides, polymers, higher fatty acids or phosphoric acid esters in finely divided form is also possible, as well as passivation in the gaseous phase, for example in the procedure for crushing film fragments in an air jet crusher, but it is less preferred. The preferred situation involves using carboxylic acids, phosphoric acids, phosphomolybdic acid or phosphoric acid ester, chromic acid or also mixtures of a plurality of passivation agents in aqueous, alcohol, ketone-type, alkane-type, ether-type or other organic solvents such as tetrahydrofuran, propylacetate or toluene or also mixtures thereof. In regard to the carboxylic acids, higher fatty acids such as stearic acid, oleic acid, myristic acid or for example salts such as for example sodium stearate or zinc stearate are particularly suitable. Dicarboxylic acid or salts thereof can also be used.

Phosphoric acid can also be used in the form of a monobasic or polybasic acid. Among the possible phosphoric acid esters, those based on higher fatty alcohols are particularly preferred. Chromic acid ($CrO_3$) is desirably applied in the form of a 20% aqueous solution.

The concentration of the passivating agent in the liquid medium is selected to be between 5 and 30% by weight under normal circumstances. In the exceptional case of liquid passivation agents it is also possible to operate in a 100% concentrate, thus for example when using oleic acid. The passivating treatment in a liquid medium itself is preferably effected over a period of between 1 and 5 hours. During that period the pigment-bearing suspension is carefully stirred. After the treatment the pigment is filtered off, possibly washed and dried. The need for the washing operation arises only in relation to $CrO_3$-treatment. All experience indicates that a 'post-maturing phase', during which the pigment is exclusively stored for between 3 and 4 weeks, increases the quality of passivation. Analyses show that, depending on the particle size, between 0 and 30% by weight of the passivating agent is firmly 'attached' to the surface of the pigment.

The corrosion-stable single-layer and multi-layer pigments according to the invention are used for material coloring purposes, in particular for coloring decorative coatings in the lacquer, varnish, paint, plastic material, printing and ceramic sectors.

The boiling test in water described in DE-A 40 30 727 for example serves for quickly checking the effectiveness of passivation, that is to say the water-resistance of the pigments. In that procedure, 1.5 g of the metal or multi-film pigment to be tested is pre-dispersed in the form of paste in 10 g of butyl glycol and then introduced with 150 g of water into a gas-tightly closable apparatus. The mixture is then heated until boiling occurs and the time required until 400 ml of hydrogen is developed is recorded.

Non-stabilised pigments react within a few minutes. The pigments produced according to the invention on the other hand requires boiling times of at least 15 hours until 400 ml of hydrogen is developed.

The following Examples serve to further describe the invention and by means of the above-indicated tests illustrate the achieved passivation and corrosion resistance of the pigments according to the invention.

EXAMPLES

Production of metal-bearing particles as a starting product for pigment production.

A. In a roll coater, a 90 nm thick aluminum layer is applied by vapor deposition of molten aluminum, to a polyester foil coated with an acrylic resin-based release layer. The aluminum layer is removed from the roll coater and peeled off by means of acetone by dissolving away the release layer. The fragments of the layer are decanted off and washed with white spirit (300% residual solvent).

B. In a roll coater, the following layers are applied by sputtering in succession one upon the other, to a polyester foil coated with an acrylic resin-based release layer:
  1. (M') a 10 nm thick semi-transparent aluminum layer
  2. (T) a 500 nm thick transparent $SiO_2$-layer
  3. (M) a 60 nm thick opaque aluminum layer
  4. (T) a 500 nm thick transparent $SiO_2$-layer
  5. (M') a 10 nm thick semi-transparent aluminum layer.

The result obtained is a multi-layer film having a clear green/red color flop. That film is removed from the roll coater and peeled off the substrate with solvent (THF/water/ethanol=1:1:1, or acetone). The fragments are filtered off.

C. Procedure as in A above with the difference that layers 1. (M'), 3. (M) and 5. (M') do not comprise pure aluminum but an aluminum/chromium alloy comprising 95% by weight of Al and 5% by weight of Cr.

D. Procedure as in A with the difference that the layers 1. (M'), 3. (M) and 5. (M') do not comprise pure aluminum but a Hydronalium alloy comprising 92.9% by weight of Al, 7% by weight of Mg and 0.1% by weight of Si.

Passivation of the fragments

Example 1

Coating of single-layer pigments

The slurry in accordance with Example A, containing solvent and aluminum film fragments, is introduced into a chromic acid ($CrO_3$)-bearing aqueous solution which contains 12% by weight of $CrO_3$ and 88% by weight of water. The suspension is then treated in an ultrasonic crusher over a period of 60 minutes at 30° C. The pigment is then decanted, washed a plurality of times with isopropanol and finally put into the definitive form of a ready-for-sale isopropanol-bearing paste.

Example 2

Coating with oleic acid solution

The multi-layer film fragments produced in B are introduced in a solvent-moist condition into an oleic acid ($C_{17}H_{33}COOH$)-containing alcohol solution (30% by weight of oleic acid, 70% by weight of ethanol) and then treated in a commercially available ultrasonic crusher over a period of about 1 hour. After that, the particle size is between 3 and 60 $\mu$m. The particles are then also carefully stirred over a further period of 4 hours. Thereafter, cooling is effected, followed by filtration, washing with a solution comprising 95% by weight of ethanol and 5% by weight of oleic acid, and drying at 50° C. in a vacuum drying chamber. The powder is then stored at ambient temperature for 4 weeks.

The pigment powder passivated in that way has a C-proportion of 4% by weight.

Example 3

Coating with phosphate solution

The multi-layer film fragments produced in B are introduced in solvent-moist condition into a triethylphosphate $((C_2H_5)_3PO_4)$-containing alcohol solution (20% by weight of triethylphosphate, 77% by weight of ethanol and 3% by weight of $H_2O$) and then treated in an ultrasonic crusher over a period of about 1 hour. After this, the particle size is between 3 and 60 $\mu$m. The particles are then carefully agitated for a further period of 3 hours at 50° C. After that, cooling is effected, followed by drying at 50° C. in a vacuum drying chamber. The powder is stored at ambient temperature over a period of 4 weeks.

The pigment powder passivated in that way has a P-proportion of 0.4% by weight.

Example 4

Coating with chromate solution

The multi-layer film fragments produced in B are introduced in a solvent-moist condition into a chromic acid ($CrO_3$)-bearing aqueous solution. The solution contains 10% by weight of $CrO_3$ and 90% by weight of $H_2O$. The fragments are then adjusted to particle sizes of between 3 and 60 μm in an ultrasonic crusher over a period of about 1 hour. After that, the suspension is carefully agitated at 40° C. over a period of 2 hours, then the pigment is filtered and washed with water. Drying is effected at 60° C. in a vacuum drying chamber and the powder is stored for 2 weeks.

The pigment contains 1.4% by weight of chromium.

Example 5

Coating with zinc stearate solution.

The multi-layer film material produced in C is dried in a vacuum drying chamber at 50° C. and then introduced into a water/xylene-bearing zinc stearate solution (10% by weight of zinc stearage, 5% by weight of water, 85% by weight of xylene) and brought to particle sizes of between 5 and 50 μm in an ultrasonic crusher. After this, the suspension is heated for 2 hours at 80° C., with careful agitation. The pigment is then filtered off, dried in a vacuum drying chamber at 50° C. and stored for 4 weeks.

Example 6

Coating with chromate solution

The multi-layer film fragments produced in D are introduced in a solvent-moist condition into chromic acid ($CrO_3$)-bearing solution (15% by weight of $CrO_3$ and 85% by weight of $H_2O$) and brought to particle sizes of between 5 and 60 um in an ultrasonic crusher. After this, the suspension is agitated for 2 hours at 40° C. The pigment is then filtered off, washed with $H_2O$, at 60° C., dried in a vacuum drying chamber at 50°, and stored for 4 weeks.

Example 7

Polymer coating in solution 125 g of single-layer pigment particles produced by PVD with a mean particle size of 18 μm is dispersed in 1300 g of white spirit and heated to 120° C. Firstly 7.6 g of 3-methacryloxypropyltrimethoxysilane in 20 g of white spirit is added followed by 0.3 g of vinyl phosphonic acid in 20 g of white spirit, 0.3 g of water and 5.0 g of butan-2-ol and stirred for 1 hour at 120° C. After this, 12 g of trimethylolpropanetrimethacrylate in 20 g of white spirit and then within 30 minutes a slurry of 0.4 g of 2.2-azobis(2-methylpropane nitrile) in 10 g of white spirit are added. Agitation is effected for 5 hours at 120° C., the reaction mixture is left to cool down and the coated pigment is separated off by way of a suction filter. The filter cake obtained is freed of solvent in the vacuum drying chamber.

In the boiling test the pigment only developed 100 ml of hydrogen after 22 hours.

Example 8

Polymer coating in solution

Using the mode of operation of Example 7 corrosion-stable pigments are produced using 0.2 g of 2-carboxyethane phosphonic acid and 0.2 g of aminoethane phosphonic acid respectively, instead of 0.3 g of vinyl phosphonic acid.

In the boiling test the pigments produced in that way develop 120 ml and 125 ml of hydrogen respectively after 20 hours.

Example 9

Coating with phosphate using a CVD process 100 g of single-layer pigment particles (mean particle size 20 μm) is fluidised in a fluidised bed reactor by introducing a total of 800 l/h nitrogen as a fluidization gas, and heated to 200° C. A flow of 200 l/h of the fluidization gases is passed through an absorption bulb heated to 70° C. and loaded with 20 ml of $POCl_3$. A further 200 l/h of nitrogen is loaded with water vapor in a second absorption bulb heated to 50° C. and charged with water, and transferred into the reactor. The remainder of the fluidization gases is blown directly through the lower opening of the reactor by way of the frit bottom.

The total $POCl_3$-amount was consumed after about 2 hours. Analysis showed 0.82% by weight of P in the passivated pigment. In the boiling test the pigment developed 90 ml of hydrogen after 22 hours.

Example 10

Coating with phosphite using a CVD process.

A similar procedure as in Example 9 is adopted, but using 24 ml of trimethylphosphite with an absorption bulb temperature of 20° C. and with a reaction time of 3 hours.

The finished pigment contains 2.8% by weight of P; in the boiling test it develops 60 ml of hydrogen after 24 hours.

Example 11

Coating with vanadate using a CVD-process

A similar procedure as in Example 9 is employed, but using 28 ml of $VOCl_3$ with an absorption bulb temperature of 20° C. and a reaction time of 5 hours.

The pigment coated in that way contains 13% by weight of V; 360 ml of hydrogen is formed in 22 hours in the boiling test.

Example 12

Coating with molybdic acid in solution 200 g of pigment particles (mean particle size 15 μm) is dispersed in 2000 ml of propyleneglycolmonomethylether and mixed at 15 to 20° C. with a pH-value of 9 with an aqueous solution of 20 g of ammonium paramolybdate $(NH_4)_6Mo_7O_{24} \cdot 4H_2O$ in 400 g of deminerealized water, by a dropwise procedure. After a reaction time of 1 hour the reaction product is isolated by means of a suction filter and washed a plurality of times with demineralized water in order to remove ammonium salts and unreacted molybdate. The pigment coated in that way contains 5.2% of Mo and developed 85 ml of hydrogen in the boiling test after 24 hours.

Example 13

Coating with cerium silicate solution 100 g of pigment powder (mean particle size of 12 μm) is dispersed in 600 ml of propyleneglycolmonobutylether and stirred with an aqueous solution of 50 g of cerium silicate for 15 hours at ambient temperature. The pigment is then separated off by way of a suction filter.

The pigment powder obtained contains 14.0% by weight of Ce and in the boiling test forms 150 ml of hydrogen after 22 hours.

Example 14

Coating with organophophites $(RO)_2PHO$ 100 g of pigment powder is dispersed in 1000 g of white spirit and mixed with 8 g of dioctylphosphite in 100 g of white spirit at abient temperature and intensively stirred for 24 hours. The pigment is then separated off by means of a suction filter and dried at 90° C. in a vacuum drying chamber. The pigment coated in that way contains 0.76% by weight of P and in the boiling test develops a 90 ml of hydrogen after 20 hours.

Example 15

Coating with modified titanates in solution 100 g of pigment powder is homogeneously dispersed in 800 g of ethylacetate, mixed with a solution of 20 g of isopropyltri(dioctyl)pyrophosphatotitanate (KR 38S, from the company Kenrich) in 100 g of ethylacetate and intensively stirred for 24 hours at ambient temperature. The pigment is then separated from the solvent and dried in a vacuum drying chamber at 50° C.

The pigment coated in that way contains 0.5% by weight of Ti and 2.2% by weight of P and in the boiling test develops 70 ml of hydrogen after 24 hours.

It will be appreciated that the foregoing Examples of compositions and procedures according to the invention have only been set forth by way of illustration thereof and that various other modifications and alterations may be made therein without thereby departing from the invention.

What is claimed is:

1. Aluminum-based metal pigment comprising one or more layers of aluminum of aluminum alloy produced by physical vapor deposition (PVD) of a metal film and subsequent crushing thereof,
   wherein all non-planar metal surfaces which are exposed by the step of crushing the metal film produced by PVD are covered with a passivating protective layer during the crushing of said metal film.

2. Metal pigment as set forth in claim 1 wherein said metal surfaces include fracture surfaces of the metal pigment particles.

3. Metal pigment as set forth in claim 1 which to produce variable color effects has a multi-layer structure of the type M'TMTM',
   wherein M' is a semi-transparent aluminum layer, T is a transparent low-refracting dielectric and M is a highly reflecting opaque aluminum layer, and
   wherein the passivating protective layer is additionally applied to the layer M' and also extends over fracture surfaces of the pigment particles.

4. Metal pigment as set forth in claim 3
   wherein at least one of said aluminum layers is an aluminum-based metal layer.

5. Metal pigment as set forth in claim 3
   wherein at least one said metal layer comprises a corrosion-stable aluminum alloy.

6. Metal pigment as set forth in claim 5
   wherein said aluminum alloy is a chromium-bearing aluminum alloy.

7. Metal pigment as set forth in claim 1
   wherein the passivating protective layer comprises at least one substance selected from the group consisting of carboxylic acids, phosphoric acids, phosphonic acids and derivatives of said substances with between 8 and 20 C-atoms and slat-like compounds of the substances of said group.

8. Metal pigment as set forth in claim 1
   wherein the passivating protective layer comprises at least one metal oxide layer of at least one metal of the group consisting of B, Al, Sn, Ti, V, Cr, Mo, Zn and Ce.

9. Metal pigment as set forth in claim 1
   wherein the passivating protective layer comprises at least one metal oxide hydrate layer of at least one metal of the group consisting of B, Al, Sn, Ti, V, Cr, Mo, Zn and Ce.

10. Metal pigment as set forth in claim 1
    wherein the passivating protective layer comprises a substance from the group consisting of organically modified silicate, titanate, zirconate and aluminum zirconate.

11. Metal pigment as set forth in claim 1
    wherein the passivating protective layer comprises an organic polymer based on at least one acrylate.

12. Metal pigment as set forth in claim 1
    wherein the passivating protective layer comprises an organic polymer based on at least one methacrylate.

13. A method of manufacturing paints, lacquers, printing inks and plastic materials, said method comprising utilizing a metal pigment as set forth in claim 1.

* * * * *

UNITED STATES PATENT AND TRADEMARK OFFICE
CERTIFICATE OF CORRECTION

PATENT NO. : 6,287,695 B1
DATED : September 11, 2001
INVENTOR(S) : Kaupp et al.

It is certified that error appears in the above-identified patent and that said Letters Patent is hereby corrected as shown below:

Column 7,
Line 28, now reads "60 um" should read -- 60 μm --

Column 9,
Line 26, now reads "aluminum of" should read -- aluminum or --

Column 10,
Line 15, now reads "slat-like" should read -- salt-like --

Signed and Sealed this

Twenty-third Day of April, 2002

Attest:

JAMES E. ROGAN
Attesting Officer     Director of the United States Patent and Trademark Office